(12) United States Patent
Garcia (10) Patent No.: US 7,402,994 B2
(45) Date of Patent: Jul. 22, 2008

(54) SELF-CLEANING LOWER CONTACT

(75) Inventor: Douglas J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/916,063

(22) Filed: Aug. 9, 2004

(65) Prior Publication Data

US 2006/0028224 A1 Feb. 9, 2006

(51) Int. Cl.
*G01R 31/02* (2006.01)

(52) U.S. Cl. .................................. 324/158.1

(58) Field of Classification Search ......... 324/754–762, 324/765; 439/482, 66–72
See application file for complete search history.

(56) References Cited

U.S. PATENT DOCUMENTS

| | | | | |
|---|---|---|---|---|
| 3,340,727 A | * | 9/1967 | Bracalente et al. ............. | 73/86 |
| 4,574,236 A | * | 3/1986 | Hechtman ..................... | 324/754 |
| 5,118,299 A | * | 6/1992 | Burns et al. ................... | 439/74 |
| 5,172,473 A | * | 12/1992 | Burns et al. ................... | 29/885 |
| 5,764,072 A | * | 6/1998 | Kister ........................... | 324/754 |
| 5,842,579 A | | 12/1998 | Garcia et al. .................. | 209/573 |
| 5,936,421 A | * | 8/1999 | Stowers et al. ................ | 324/761 |
| 6,040,705 A | | 3/2000 | Garcia et al. .................. | 324/762 |
| 6,118,289 A | * | 9/2000 | Kitani et al. .................. | 324/754 |
| 6,130,104 A | * | 10/2000 | Yamasaka ..................... | 438/14 |
| 6,204,681 B1 | * | 3/2001 | Nagatsuka et al. ............ | 324/761 |
| 6,677,772 B1 | * | 1/2004 | Faull ............................. | 324/761 |
| 6,714,028 B2 | * | 3/2004 | Garcia et al. .................. | 324/754 |
| 2003/0197500 A1 | | 10/2003 | Saulnier et al. ............... | 324/158.1 |
| 2004/0217764 A1 | | 11/2004 | Sasaoka ......................... | 324/629 |
| 2004/0239356 A1 | | 12/2004 | Kazama ......................... | 324/761 |

FOREIGN PATENT DOCUMENTS

EP 0 418 454 A2 3/1991
JP WO 03/005043 A1 1/2003

OTHER PUBLICATIONS

Product Information: Model 3340 Enhanced Productivity MLCC Multi-function Tester, Electro Scientific Industries, Inc. 2003.

* cited by examiner

*Primary Examiner*—Vinh P Nguyen
(74) *Attorney, Agent, or Firm*—Stoel Rives LLP

(57) ABSTRACT

An electrical component handler that tests electrical circuit components and includes a self-cleaning lower contact offers reduced yield loss and mean time between assists. A preferred embodiment of the electrical component handler includes multiple sets of upper and lower contacts, each set of which is spatially aligned to electrically contact a single device-under-test (DUT). Each DUT is seated in a test plate that transports the DUT to and from a test measurement position between the upper and lower contacts. The lower contact includes a contact tip that a biasing mechanism urges against the electrical component as it undergoes a test process and against a surface of the test plate as it transports the electrical component. The lower contact rubs against the test plate, thereby contributing to removal of contaminant material acquired by the contact tip during component handler operation.

14 Claims, 10 Drawing Sheets

SELF-CLEANING LOWER CONTACT

TECHNICAL FIELD

The invention relates to electrical component handlers that test electrical circuit components, and in particular, to a self-cleaning lower contact for use in an electrical component handler.

BACKGROUND OF THE INVENTION

Electrical component handlers receive electrical circuit components, e.g., ceramic capacitors, present the electrical circuit components to an electronic tester for testing, and sort the electrical circuit components according to the results of the testing. An exemplary electrical component handler is described in U.S. Pat. No. 5,842,579 to Garcia et al. (the '579 patent), which is assigned to Electro Scientific Industries, Inc., the assignee of the present patent application. Design and operational advantages of the electrical component handler of the '579 patent include (1) the elimination of manual seating of components for test purposes and manual sorting; (2) the ability to handle a greater quantity of components per unit time than prior art electrical component handlers are able to handle; (3) the ability to take a randomly oriented heap of components and properly orient them; (4) the ability to present the components to a tester in multiples; and (5) the ability to sort the tested parts into a plurality of receiving or sorting bins.

Figure 1:
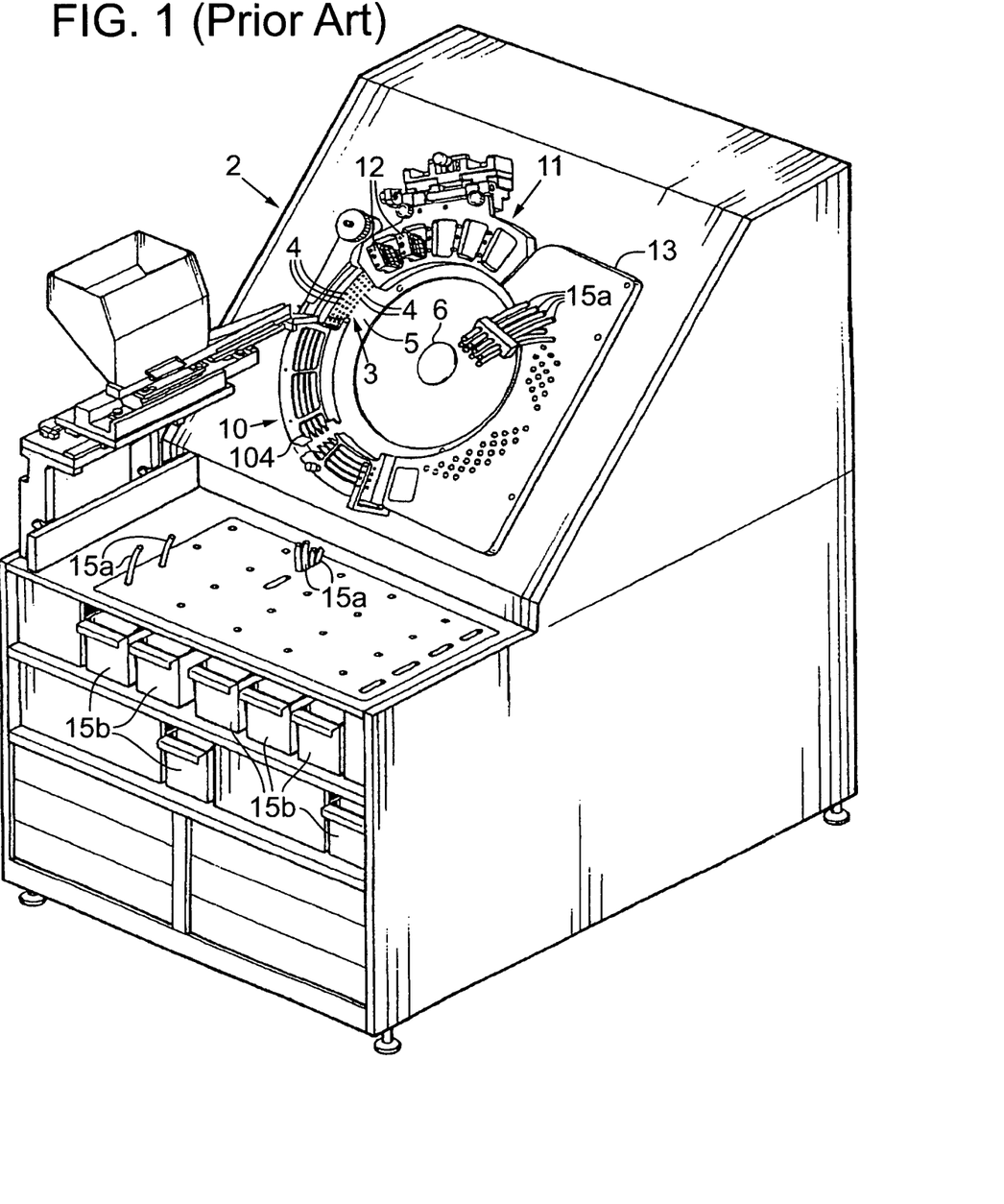
FIG. 1 is a pictorial view of an exemplary prior art electrical component handler.

FIG. 1 is a pictorial drawing of an electrical component handler 2 as described in the '579 patent. In electrical component handler 2, one or more concentric rings 3 of component seats 4 formed in an annular test plate 5 are rotated in a clockwise direction around a turntable hub 6. As test plate 5 turns, component seats 4 pass beneath a loading area 10, a contact head 11 of five contact modules 12 (two shown in FIG. 1), and an ejection manifold 13. In loading area 10, electrical circuit components or devices-under-test (DUTs) 14 (FIG. 3) are poured into concentric rings 3, causing unseated DUTs 14 to tumble randomly until they are seated in test plate seats 4. DUTs 14 are then rotated beneath contact head 11, and each DUT 14 is electrically contacted and parametrically tested. Once DUTs 14 have been tested, ejection manifold 13 ejects DUTs 14 from their seats by blasts of air from selectively actuated, spatially aligned pneumatic valves. Ejected DUTs 14 are preferably directed through ejection tubes 15a into sorting bins 15b.

Figure 2:
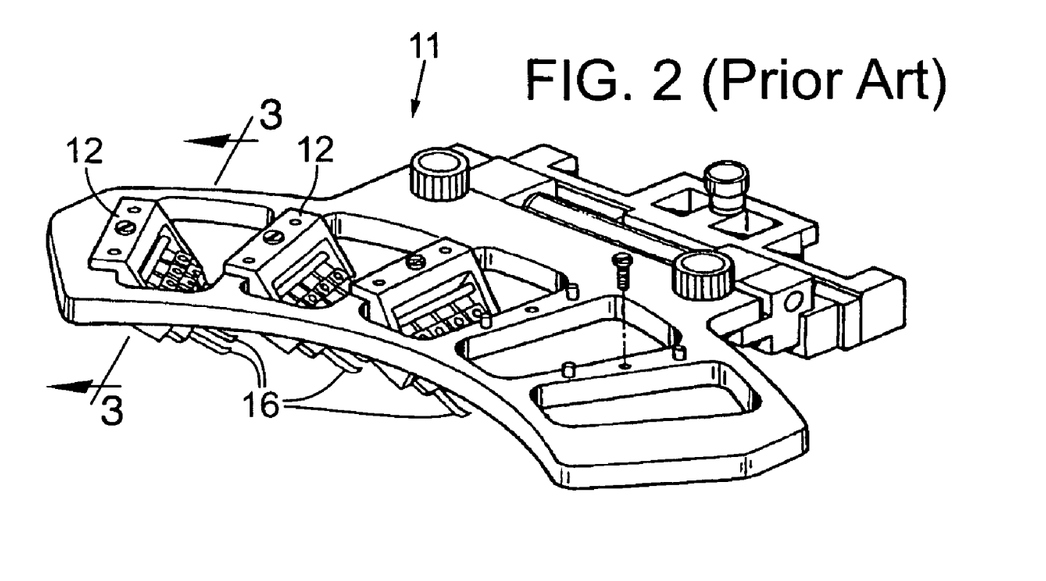
FIG. 2 is a pictorial view of a prior art contact head assembly to which are mounted less than a full complement of contact modules.
Figure 3:
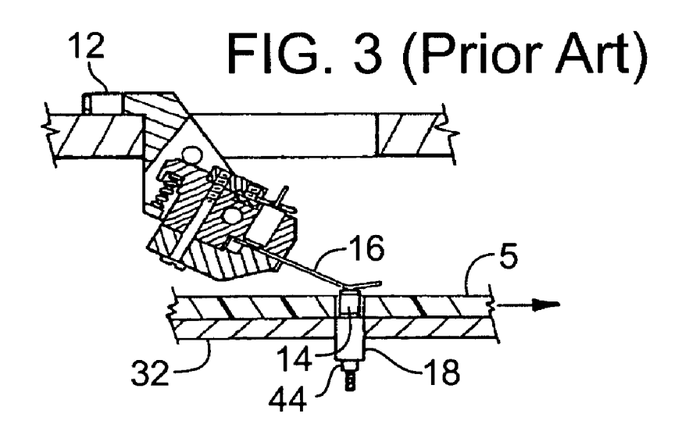
FIG. 3 is a fragmentary sectional view taken along lines 3-3 of FIG. 2 juxtaposed with a fragmentary cross-sectional view of a DUT seated in a test plate.

FIGS. 2 and 3 show prior art contact head 11 of the '579 patent in greater detail. Specifically, FIG. 2 shows a pictorial drawing of contact head 11 with less than a full complement of contact modules 12 mounted thereon; and FIG. 3 is a fragmentary sectional view taken along lines 3-3 of FIG. 2 juxtaposed with a fragmentary cross-sectional view of a DUT 14 seated in test plate 5. With reference to FIGS. 2 and 3, contact module 12 includes a plurality of upper contacts 16 and lower contacts 18 (one each shown in FIG. 3) for coupling DUT 14 to test plate 5. Upper contacts 16 are resilient flat metal cantilevered leaves with inclined elongated tips that project away at a shallow angle from test plate 5. Upper contacts 16 flex slightly when they encounter seated DUTs 14 to provide a downward contact force that is largely dictated by the thicknesses and/or end widths of the leaves. The elongated tips prevent seated DUTs 14 from popping out of their seats (as a consequence of a "tiddlywink" effect) as the leaves pass over the back edges of DUTs 14 as test plate 5 advances forward. The tips of upper contacts 16 may be coated with a metal alloy to minimize contact resistance.

Figure 4:
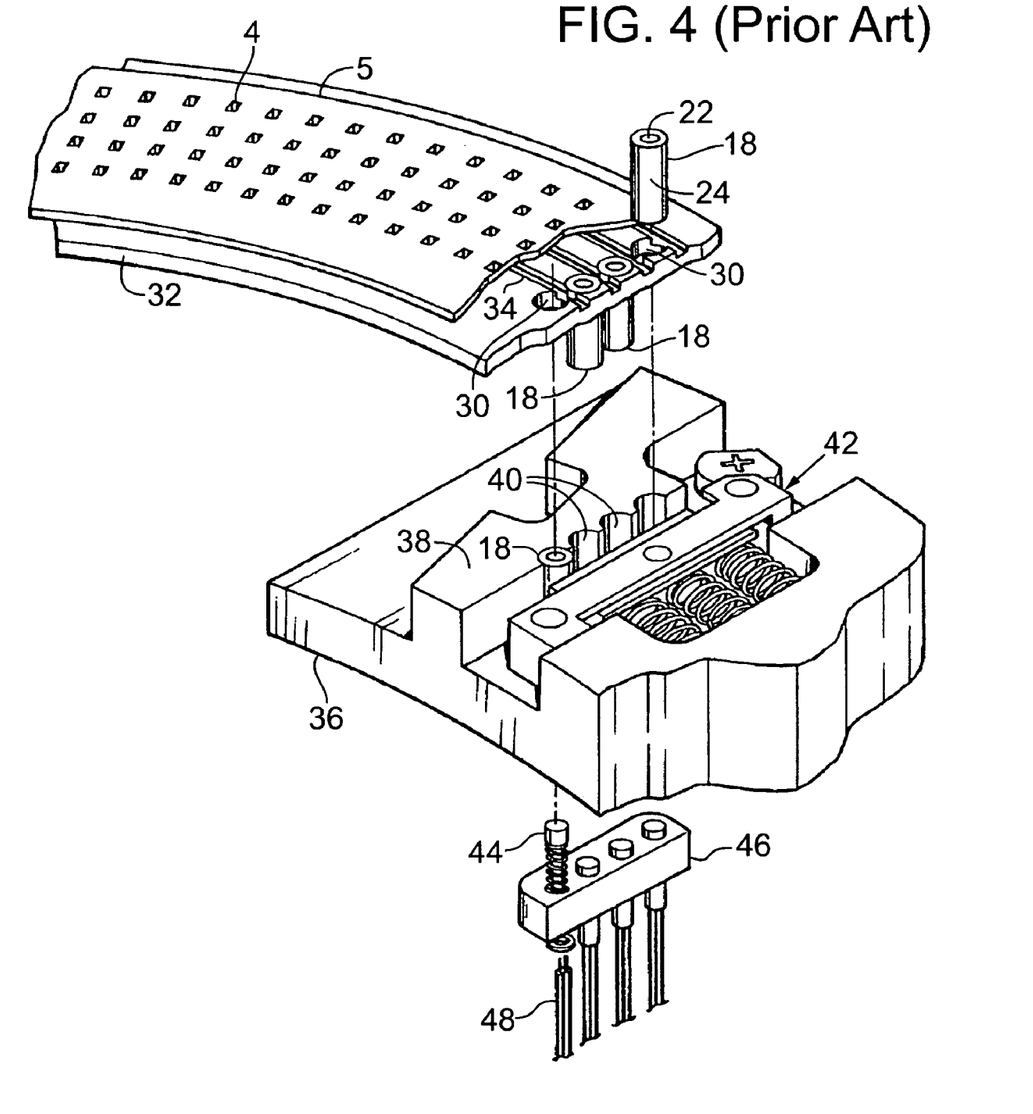
FIG. 4 is a pictorial view of the test plate of the prior art electrical component handler of FIG. 1.
Figure 5A:
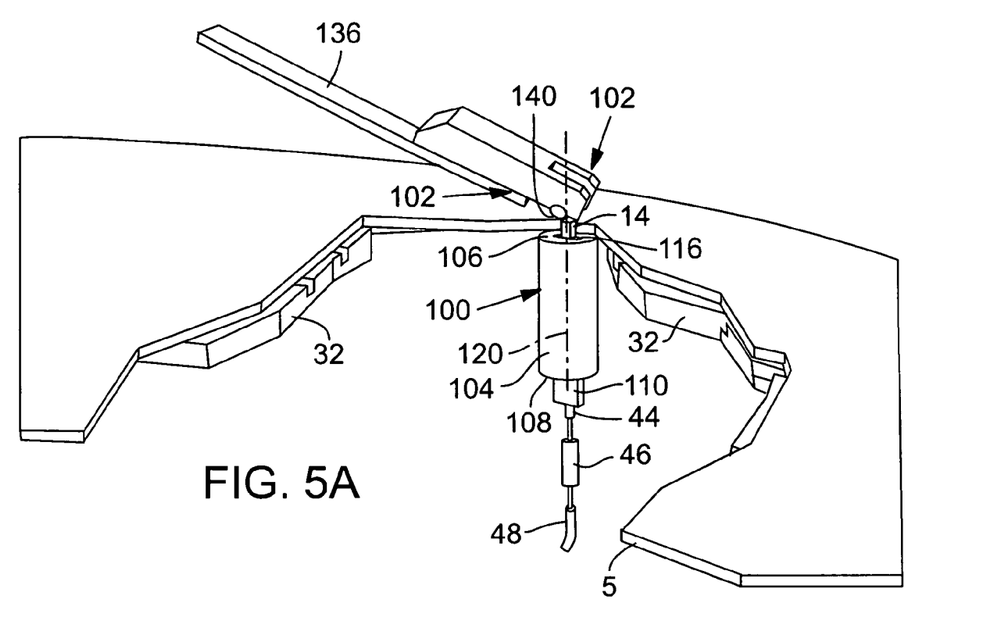
FIG. 5A is an isometric fragmentary view of test and vacuum plates with portions broken away to show a DUT in position between upper and lower contacts to undergo a test measurement.
Figure 5B:
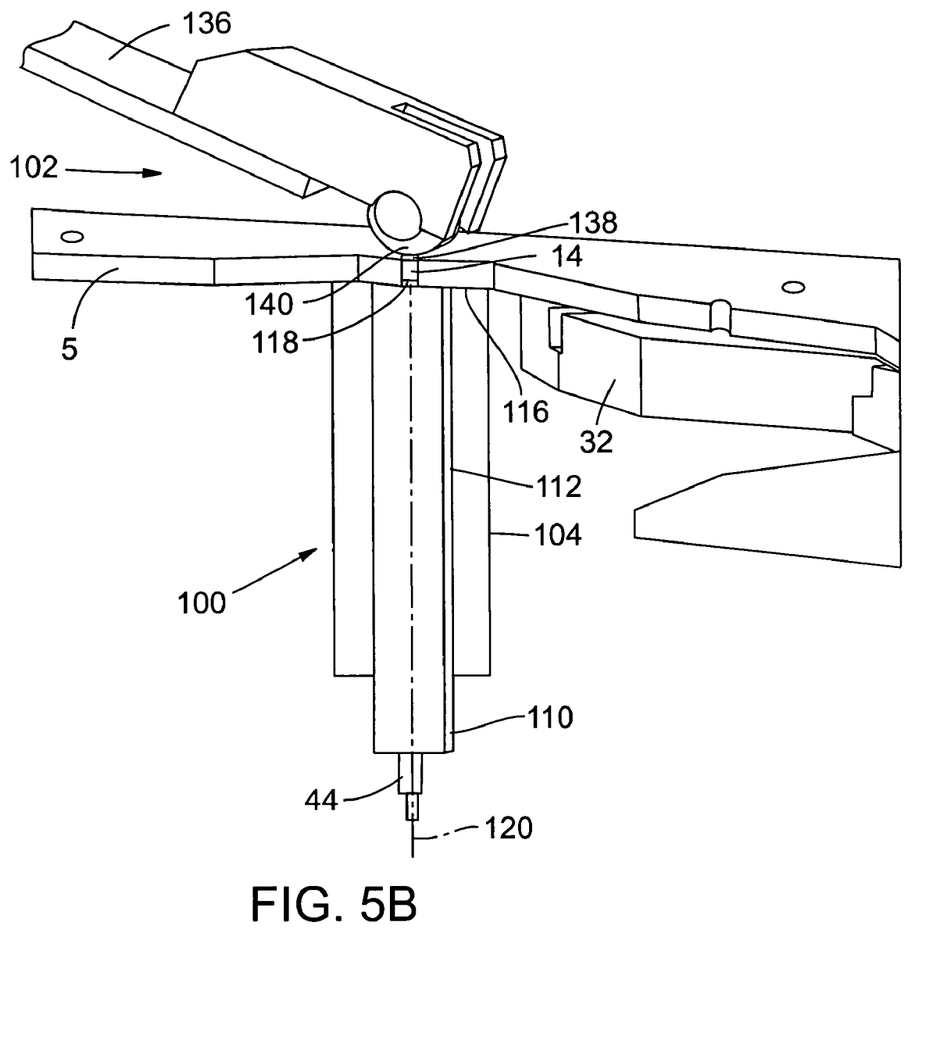
FIG. 5B is an enlarged, fragmentary side elevation view showing partly in cross-section the lower contact positioned against the DUT undergoing the test measurement depicted in FIG. 5A.
Figure 5C:
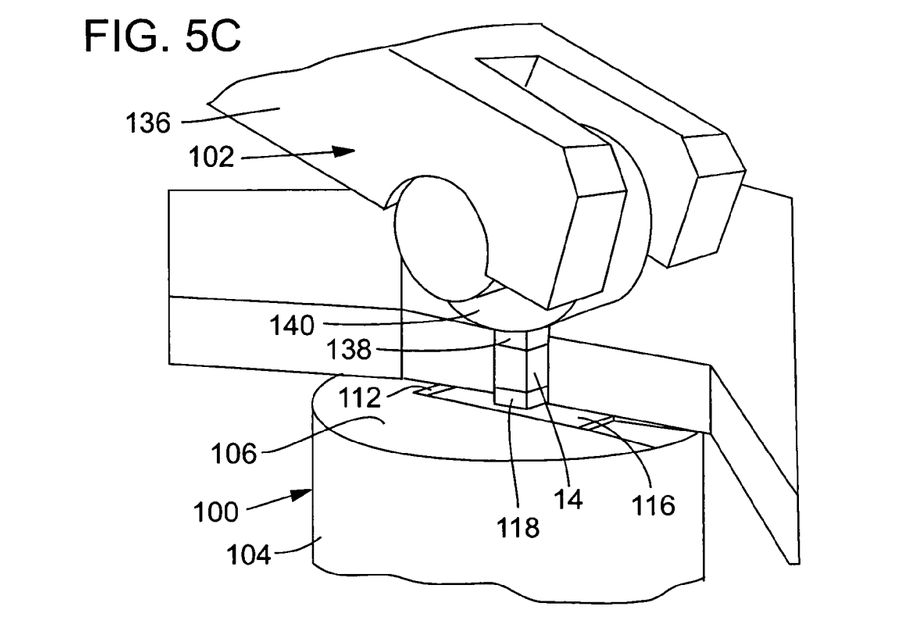
FIG. 5C is an enlarged, fragmentary isometric view of the DUT in position between the upper and lower contacts to undergo the test measurement depicted in FIG. 5A.

Lower contacts 18 are typically stationary contacts in the form of cylinders. As shown in FIG. 4, an exemplary prior art lower contact 18 is an elongated cylinder having upper and lower planar surfaces, a central conductive core 22, and an electrically insulating outer sleeve 24. Lower contact 18 extends through holes 30 formed in a vacuum plate 32 and set between adjacent vacuum channels 34 such that lower contact 18 is in alignment with its corresponding upper contact 16 and its corresponding component seat ring 3. A base member 36 positioned below vacuum plate 32 includes an upwardly projecting wall 38 formed of contiguous cylindrical scallop segments 40 that receive a row of cylinders 18. A releasable clamping mechanism 42 pushes and thereby pins outer sleeves 24 of lower contacts 18 against their associated scallop segments 40 of wall 38 to maintain their orientation normal to test plate 5. Thus, for each row of lower contacts 18, there is a clamping mechanism and a pinning wall. A corresponding plurality of spring-biased pin contacts 44 (e.g., "pogo" pins) extends through a plurality of slots (not shown) in the bottom of base member 36 to make electrical contact with central cores 22 of lower contacts 18. There is one base slot for each row of lower contacts. Pin contacts 44 are preferably mounted lengthwise by their spring-biased ends in holders 46, four for each holder to match a row of lower contacts 18. Each holder 46 is affixed in a different base slot. Pin contacts 44 are coupled to the tester electronics through wires 48.

Contact head 11 includes five contact modules 12. This embodiment includes 20 upper contacts 16, five for each ring 3 of component seats 4. Each of 20 lower contacts 18 is positioned on the opposite side of test plate 5 and in alignment with a different one of the 20 upper contacts 16, as indicated in FIG. 3 for one pair of upper and lower contacts. Thus, contact head 11 includes a full complement of contact modules 12 in which the terminals of 20 DUTs 14 can be contacted simultaneously, thereby simultaneously coupling all 20 of them to test plate 5.

Upper and lower contacts 16 and 18 of contact modules 12 become contaminated during operation of electrical component handler 2. Exemplary contamination sources include friction polymerization; external debris, such as material deposits from previously tested devices; and naturally occurring oxide formation on the contact surface. Additionally, some amount of debris, such as broken devices, plating media, or fragments of refractory carriers, is typically present in or on DUTs 14. This debris is often introduced into the test system and subsequently placed in contact with lower contacts 18. Contamination of upper and lower contacts 16 and 18 creates contact resistance variation that is additive to the actual resistance measurement for each DUT 14. This contamination of upper and lower contacts 16 and 18 results in rejection of acceptable DUTs 14, resulting in yield loss and a reduction in the mean time between assists (MTBA) associated with electrical component handler 2. When stationary lower contacts 18 are used in electrical component handler 2, about 5.89% of DUTs 14 are falsely rejected.

Consequently, periodic cleaning of upper and lower contacts 16 and 18 is required to facilitate accurate DUT measurement. The most common prior art method of cleaning upper and lower contacts 16 and 18 entails stopping operation of electrical component handler 2 and mechanically cleaning upper and lower contacts 16 and 18. However, stopping electrical component handler 2 results in lost productivity and reduces machine throughput by lowering the MTBA.

Another prior art method of removing contamination and debris entails the use of jam sensors or jam-clearing mechanisms. Implementing these additional devices increases the manufacturing and repair costs, as well as the mechanical complexity, of electrical component handler 2.

Thus a need exists for a device that is capable of carrying out an effective and efficient method of cleaning the contacts of an electrical component handler.

SUMMARY OF THE INVENTION

The present invention is a device that carries out an effective and expedient method of cleaning a lower contact of an electrical component handler during its operation and thereby reducing yield loss and increasing the MTBA associated with the electrical component handler.

A preferred electrical component handler includes a contact head having multiple sets of associated upper and lower contacts. The upper contact and the lower contact in each set are spatially aligned to electrically contact the terminals of a single DUT. Each DUT is seated in a test plate that transports the DUT to and from at least one testing area in the component handler. The test plate has upper and lower surfaces that are positioned adjacent the upper and lower contacts, respectively. The upper contact exerts a downward force against the upper surface of the test plate as it transports the DUT and against one terminal of the DUT as it undergoes a test process. The lower contact includes a housing and an extensible contact element. The housing is preferably formed of an electrically insulating material, and the extensible contact element is movable within and outwardly of the housing and has an end portion that terminates in a contact tip. A biasing mechanism applies a force to the contact tip to urge the contact tip against a terminal of the DUT as it undergoes the test process and against the lower surface of the test plate as it transports the DUT. The urging of the contact tip against the lower surface of the test plate contributes to maintaining the DUT in a measurement position and to removal of contaminant material acquired by the contact tip during component handler operation. A roller type upper contact obviates a need for rubbing against the upper surface of the test plate to keep the upper contact free from contaminant material.

Additional aspects and advantages of this invention will be apparent from the following detailed description of preferred embodiments, which proceeds with reference to the accompanying drawings.

DETAILED DESCRIPTION OF PREFERRED EMBODIMENTS

A self-cleaning lower contact 100 constructed in accordance with a preferred embodiment of the present invention may be used to perform electrical measurements of miniature electrical circuit components, or devices-under-test (DUTs) 14, in a high-speed measurement system such as a Model 3340 Multi-Function Tester, manufactured by Electro Scientific Industries, Inc. of Portland, Oreg. FIGS. 5A, 5B, 5C, and 6 show the general construction of lower contact 100 and its operational relationship with an upper contact 102. Lower contact 100 is spatially aligned with a corresponding upper contact 102. DUTs 14 are seated in test plate 5, which is positioned between lower contact 100 and upper contact 102. Lower contact 100 is formed of an electrically insulating cylindrical housing 104 having a substantially planar upper end surface 106 and a substantially planar lower end surface 108. An extensible contact element 110 is movable in an interior opening 112 of housing 104 and outwardly of upper surface 106. Interior opening 112 is preferably a centrally located slot of generally rectangular cross section extending along the entire length of housing 104. Contact element 110 has an end portion 114 that terminates in a contact tip 116, which contacts a terminal 118 of DUT 14 as it undergoes a test process. The interior walls defining lengthwise slot 112 within housing 104 provide bearing surfaces for end portion 114 against which it moves to support straight line motion of contact element 110 along a longitudinal axis 120 of housing 104.

A biasing mechanism 130, including, for example, spring-loaded pin ("pogo pin") 44, applies a force to the end of contact element 110 positioned farther from terminal 118 of DUT 14. Biasing mechanism 130 urges contact tip 116 against terminal 118 of DUT 14 as it undergoes the test process and against a lower surface 134 of test plate 5 as it transports DUT 14 to and from different corresponding pairs of upper and lower contacts 116 and 118. Upper contact 102 is composed of a resilient flat metal cantilevered arm 136 with one end secured to a support module (not shown) and the opposite end terminating in a spring-biased roller contact 140 that contacts a terminal 138 of DUT 14. Upper contact 116 is of a roller wheel type described in U.S. Pat. No. 6,040,705, which is assigned to the assignee of this patent application.

When test plate 5 advances to place DUT 14 in physical contact with contact tip 116 of lower contact 100, lower surface 134 of test plate 5 slides over at least a portion of contact tip 116, depressing it so that it is flush with upper surface 106 of housing 104. The upward force holds contact tip 116 in physical contact with lower surface 134 of test plate 5 and terminal 118 of DUT 14 during testing. When testing is complete, the position of test plate 5 is advanced (to present the next DUT 14 to lower and upper contacts 100 and 102 for testing) and the upward force causes contact tip 116 to rub against lower surface 134 of test plate 5. Thus, contaminants or oxides are rubbed off of contact tip 116, so that it is self-cleaned during operation of electrical component handler 2, thereby eliminating the need for costly and time-consuming shutdown of the electrical component handler to clean lower contact 100.

Contact tip 116 undergoes wear removal of contact tip material that results in progressive shortening of contact element 110 as test plate 5 transports DUT. End portion 114 of contact element 110 is preferably in the shape of a flat blade, and contact tip 116 may be formed by automated stamping of a photochemical or highly conductive material, such as solid coin silver (90 wgt % Ag, 10 wgt % Cu) or plain, soft copper. Contact element 110 and contact tip 116 are preferably made of the same material, but contact tip 116 could be formed by depositing material having suitable wear characteristics on end portion 114 of different material. Contact tip 116 has a usable depth of about 3.8 mm (0.15 in) and has a sloped leading edge 144 to ensure terminal 118 of DUT 14 does not catch on contact tip 116 as test plate 5 advances DUT 14 to its measurement position between lower and upper contacts 100 and 102. A conductive coating, such as gold, silver, or rhodium, may be applied to contact tip 116 to increase its resistance to oxidation during storage.

To prevent the upward force from ejecting DUT 14 from test plate 5, a downward force that is greater than the upward force may be simultaneously exerted on or by test plate 5 against lower contact 100. The downward force may be exerted by, for example, vacuum plate 32, a plate retainer roller 146, or both of them. Further, contact tip 116 is preferably wider than seats 4 in test plate 5 such that the upward force applied against lower contact 100 does not eject DUT 14 upward and out of its seat 4.

Figure 6:
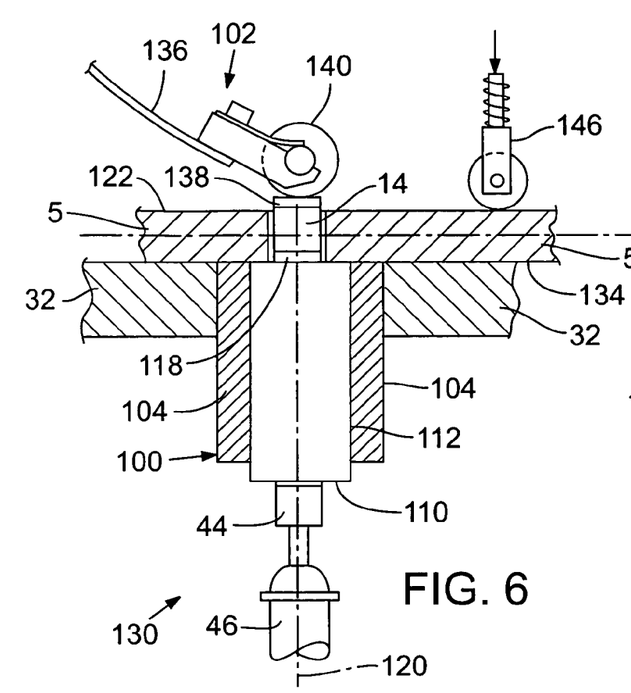
FIG. 6 is a fragmentary side elevation view showing partly in cross-section the arrangement of the test and vacuum plates and components of the lower contact as it and a roller type upper contact maintain a DUT in position in a test plate seat.

FIG. 6 shows housing 104 of lower contact 100 extending through a hole in vacuum plate 32 such that housing 104 is positioned adjacent lower surface 134 of test plate 5. A preferred vacuum plate 32 is in the form of a disk-like annulus and includes vacuum channels that are concentrically adjacent to seat rings 3. Vacuum channels 34 are connected to a partial vacuum pressure source (not shown) and communicate partial vacuum pressure to seats 4 of each ring 3 by way of linking channels through the thickness dimension of test plate 5 at seats 4. The partial vacuum pressure created by vacuum plate 32 holds it adjacent to lower surface 134 of test plate 5 and DUT 14. This positioning results in contact tip 116 simultaneously being in contact with DUT 14 and lower surface 134 of test plate 5 during a test cycle. The partial vacuum pressure draws through vacuum channels 34 contact tip material dust produced by wear of contact tip 116. Residual amounts of the dust accumulate on the bottom surface of test plate 5, which is periodically cleaned to remove the dust.

Recent technological advances in component miniaturization have resulted in the formation of DUTs 14 having length and width dimensions of about 0.016×0.008×0.008 (0402 "metric" components) and 0.024×0.012×0.12 (0201 "metric" components). Because of their small size, these DUTs are unable to tolerate large gaps, ledges, or interruptions in the surface geometry or channels along which they are transported during the testing process. If they encounter gaps, ledges, or interruptions, DUTs 14 can be easily damaged, since their terminal (electrode) ends are often coated with soft tin plating. Thus, in a preferred embodiment of electrical component handler 2, DUT 14 passes over only a very small clearance gap. For example, in one preferred embodiment, contact tip 116 is wider than the device-receiving seats 4 in test plate 5. This geometry also prevents the edge of contact tip 116 from interfering with a side wall of one of the device-receiving seats 4 in test plate 5.

Electrically insulating housing 104 is preferably constructed of either ceramic- or plastic-based wear-resistant material. Plastic material includes polycarbonate or polyphenylene sulfide (PPS), and ceramic material includes transition-toughened zirconia ceramic or alumina. Housing 104 is preferably designed to be easily removed during periodic machine maintenance and to facilitate changing vacuum plate 32. Electrically insulating housing 104 is preferably aligned relative to concentric rings 3 of component seats 4 such that upper surface 106 tracks the path of advancement of DUT 14. This alignment can be achieved by incorporating aligning features on electrically insulating housing 104, by using an alignment tool, or by a combination thereof.

Various embodiments of lower contact 100 are in the form of multiple-component assemblies and are described below and shown in the drawing figures associated with their descriptions.

Figure 7A:
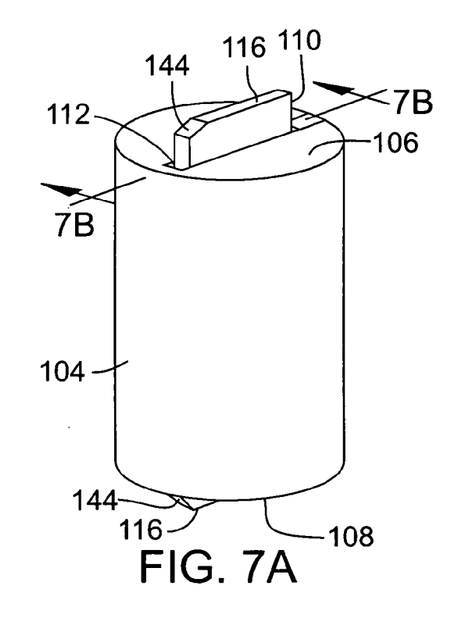
FIG. 7A is an isometric view of a double-sided, elastic lower contact configured in accordance with a preferred embodiment of the invention.
Figure 7B:
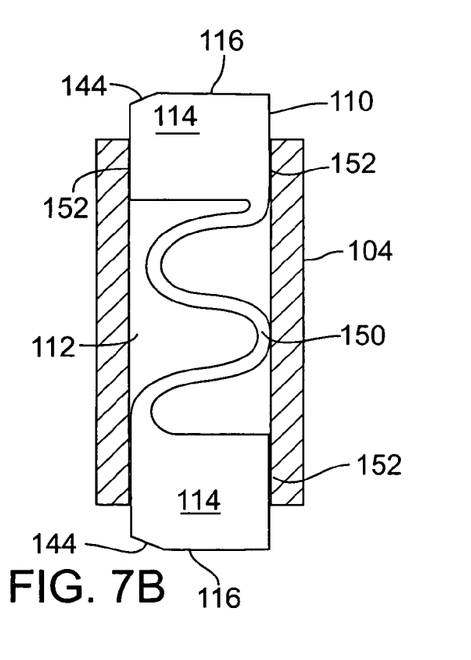
FIG. 7B is a sectional view taken along lines 7B-7B of FIG. 7A.
Figure 8:
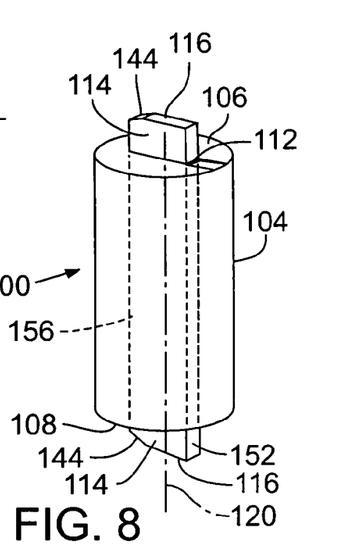
FIG. 8 is an isometric view of a double-sided, inelastic lower contact configured in accordance with a preferred embodiment of the invention.

FIG. 7A shows lower contact 100 having a housing 104 of single-piece construction of molded or cast electrically insulating material. FIGS. 7B and 8 show different embodiments of a double-sided contact element 110 set in slot 112 of housing 104 of single-piece construction. Double-sided contact element 110 is advantageous because the presence of two contact tips 116 prolongs its useful life. Double-sided contact element 116 has two end portions 114, each terminating in a contact tip 116. In the embodiment of FIG. 7B, end portions 114 are connected on opposite sides by a sinuous resilient contact body portion 150 that does not contact the interior housing walls defining slot 112. Resilient contact body portion 150 is made of phosphor bronze or beryllium copper for resilience. End portions 114 and contact tips 116 may also be made of these materials to provide a one-piece resilient contact element 110. End portion surfaces 152 move along bearing surfaces 154 of the interior housing walls defining slot 112 in response to force applied by biasing mechanism 130. In the embodiment of FIG. 7B, resilient body portion 150 provides the elasticity in the biasing force and, therefore, constitutes a part of biasing mechanism 130. In the embodiment of FIG. 8, end portions 114 constitute opposite distal ends of a unitary contact body portion 156 of generally rectangular cross-section, the end surfaces 152 of which extend along the length of contact element 110 and thereby continuously contact bearing surfaces 154. Contact element 110 has a length defined as the distance measured between contact tips 116 along longitudinal axis 120, and housing 104 has a length defined as the distance between upper surface 106 and lower surface 108. The length of contact element 110 (which becomes progressively shorter over time with wear) is greater than the length of housing 104 to enable contact tip 116 in proximal position to a DUT 14 to contact its electrode and to enable biasing mechanism 130 to engage contact tip 116 in proximal position to its end 132.

Figures 9A, 9B, 10A, 10B, 10C:
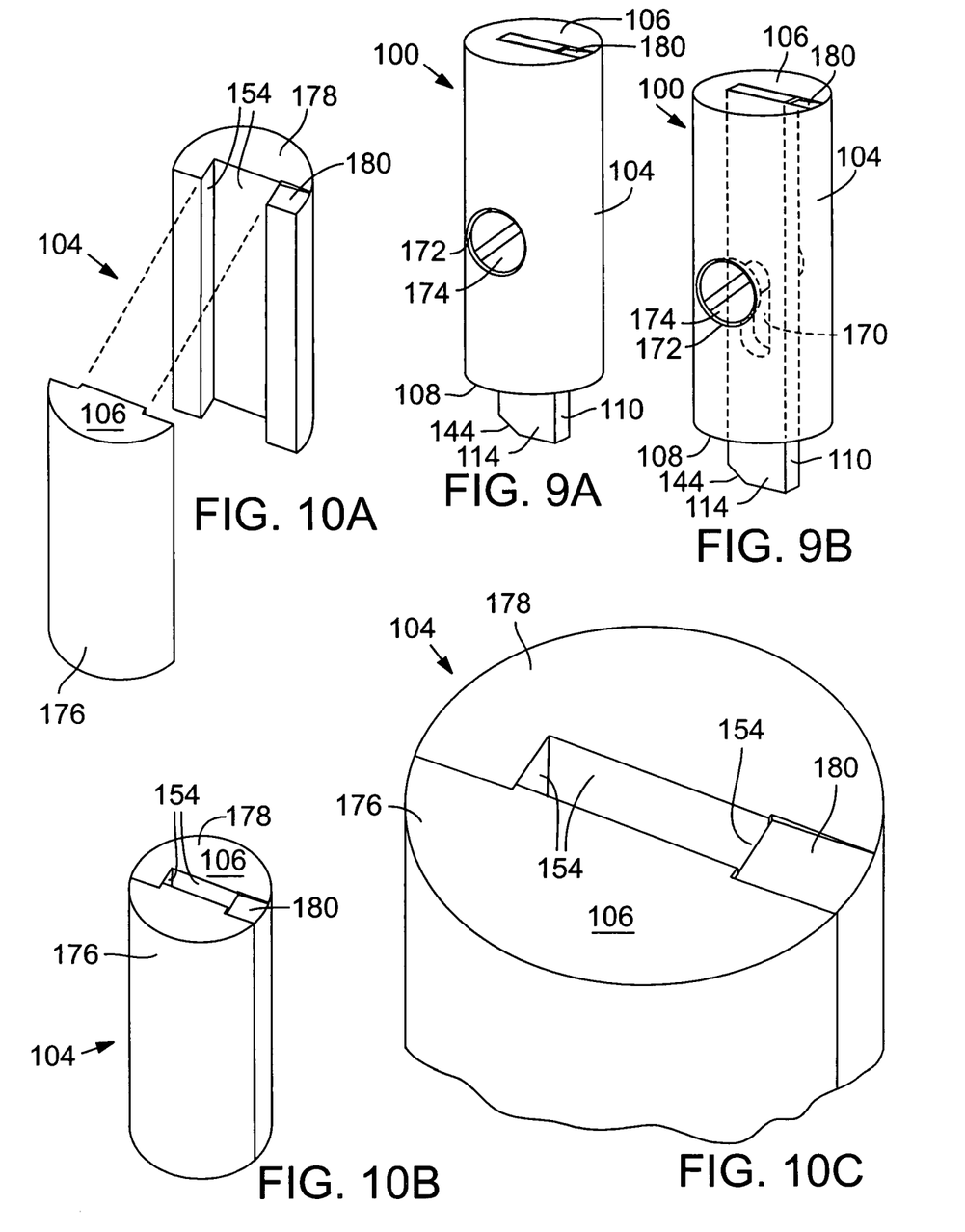
FIGS. 9A and 9B are, respectively, solid model and phantom line interior detail-revealing isometric views of a slotted extensible contact element inserted in a lower contact housing of single-piece construction.
FIGS. 10A, 10B, and 10C are, respectively, exploded, assembled, and enlarged top portion isometric views of a lower contact housing of multiple-piece construction.

FIGS. 9A and 9B show housing 104 of single-piece construction in which a contact element 110 of generally rectangular cross-section such as that shown in FIG. 8 but with a slot 170 extending along the length of contact element 110. Housing 104 has a hole 172 through which a screw 174 or other suitable fastener passes to secure contact element 110 in place and that is suitably positioned to limit to the slot length the travel of contact element 110.

FIGS. 10A, 10B, and 10C show housing 104 of multiple-piece construction of electrically insulating material composed of two body components in the form of generally cylindrical segments 176 and 178. Cylindrical segments 176 and 178 have complementary mating surfaces that fit together to form slot 112. In one embodiment, cylindrical segments 176 and 178 have axially aligned apertures through which screw 174 passes to assemble housing 104 and hold in place slotted contact element 110 in the same manner as that shown in FIGS. 9A and 9B for housing 104 of single-piece construction. In another embodiment, cylindrical segments 176 and 178 are glued together. In both of these embodiments, the opposing inner walls of cylindrical segments 176 and 178 defining slot 112 function as bearing surfaces 154 along which contact element 110 slides.

Skilled persons will appreciate from the foregoing descriptions that housing 104 of either single-piece or multiple-piece construction may include a slotted or a nonslotted contact element 110, a contact element 110 with a single-sided or double-sided contact tip 116, or interior bearing surfaces provided by a lining material for slot 112 or the slot-defining interior surfaces of housing 104 itself.

FIGS. 9A and 9B and FIGS. 10A, 10B, and 10C show a chamfer 180 formed in upper surface 106 of housing 104 of single-piece construction and multiple-piece construction, respectively. Chamfer 180 provides for DUT 14 a slide ramp of positive slope as test plate 5 moves DUT 14 off of lower contact 100 upon completion of a test measurement. This ensures that DUT 14 will not catch on an edge of slot 112 as DUT 14 is moved away from lower contact 100.

Figure 11A:
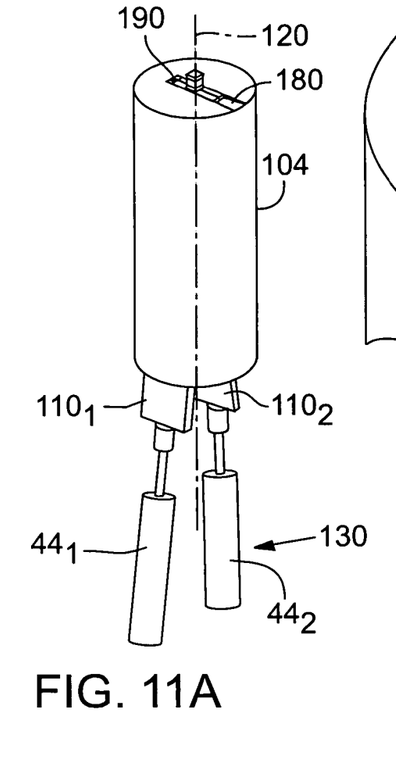
FIGS. 11A, 11B, and 11C are, respectively, solid model, enlarged top portion, and partly cut away isometric views of an embodiment of a lower contact for use in four-terminal Kelvin-connection measurements.
Figure 11B:
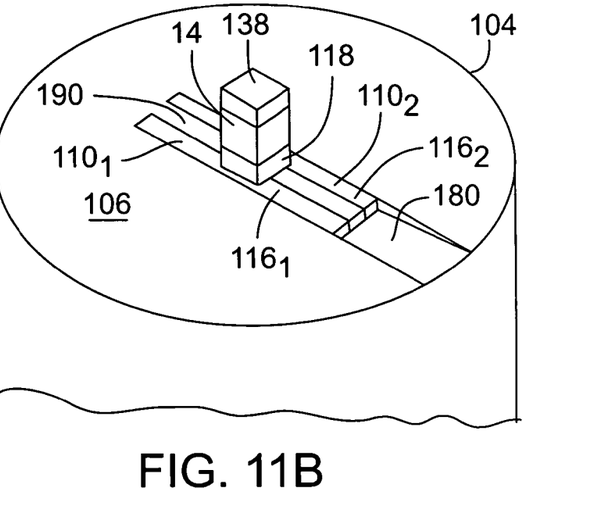
Figure 11C:
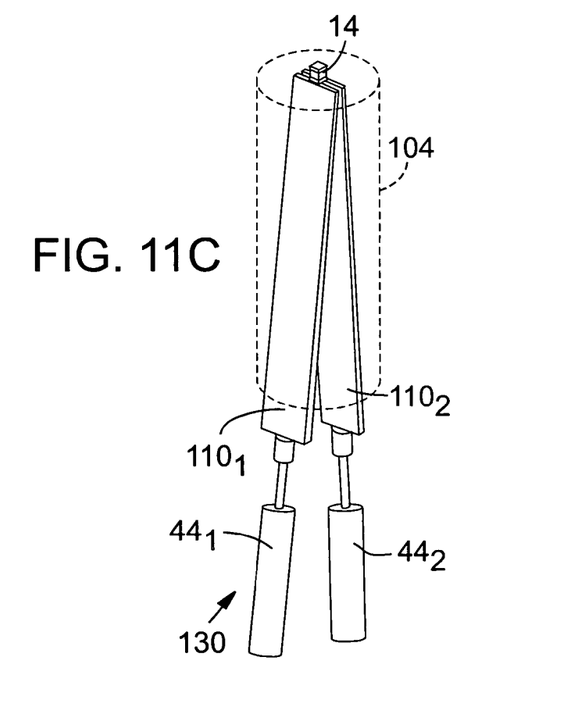

FIGS. 11A, 11B, and 11C show an embodiment of lower contact 100 for use in four-terminal Kelvin-connection measurements. The Kelvin contact embodiment of lower terminal 100 includes two lower terminal contact elements $110_1$ and $110_2$ that are separated within housing 104 by an electrical insulator 190. Terminal contact elements $110_1$ and $110_2$ are angularly inclined within housing 104 relative to longitudinal axis 120, such that their respective contact tips $116_1$ and $116_2$ converge at upper surface 106 of housing 104. For housing 104 of single-piece construction, insulator 190 is an integral part of the interior of housing 104, in which terminal contact elements $110_1$ and $110_2$ move along angularly inclined slots formed in housing 104. For housing 104 of multiple-piece construction, insulator 190 could be either a separate internal spacer component positioned between terminal contact elements $110_1$ and $110_2$ when housing 104 is assembled or an integral part of one of the housing body components. Biasing mechanism 130 comprises separate spring-loaded pin (pogo pin) contacts $44_1$ and $44_2$ that apply force against the respective ends of terminal contact elements $110_1$ and $110_2$ proximal to lower surface 108 of housing 104 to urge contact tips $116_1$ and $116_2$ against different regions of terminal 118 of DUT 14.

Figures 12, 13B:
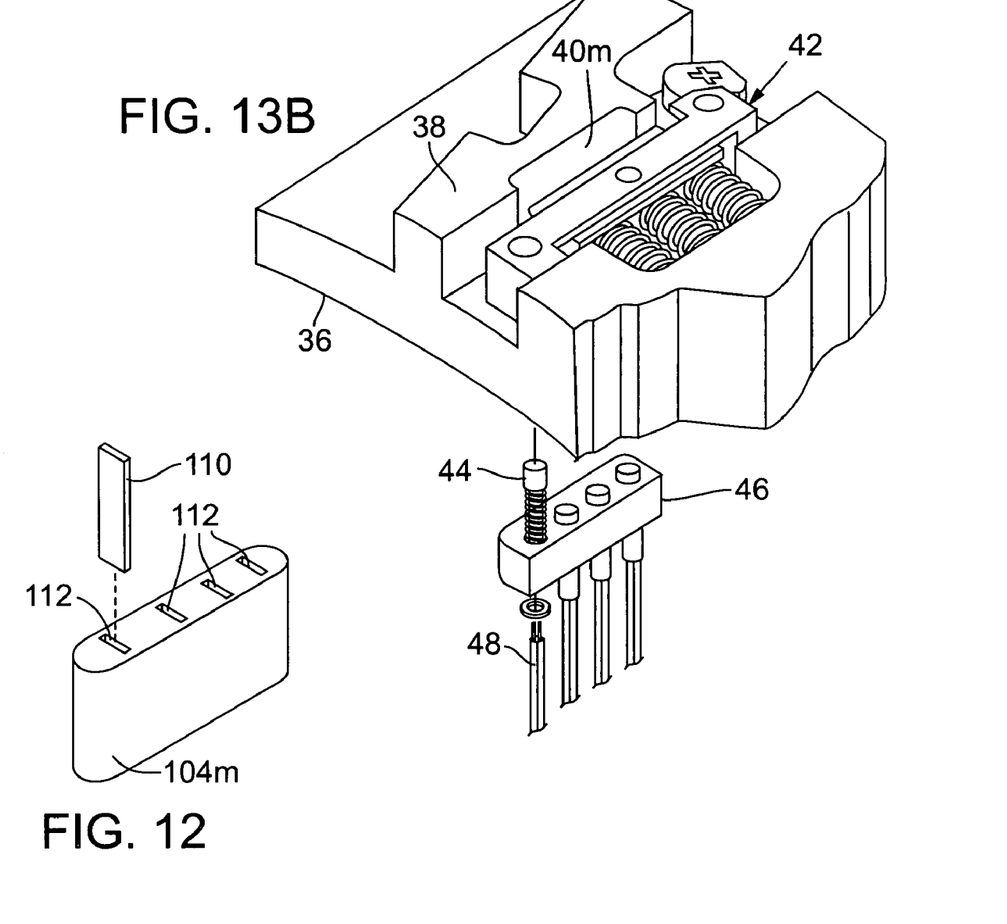
FIG. 12 is an isometric view of a common housing for multiple contact elements.
FIGS. 13A and 13B are fragmentary isometric views with portions cut away showing, respectively, a vacuum plate and a base member with an upwardly projecting wall modified to receive the common housing of FIG. 12.

FIG. 12 shows a single-piece common housing 104m in the form of a rectangle with rounded edges and four slots 112 spaced apart to receive multiple separate contact elements 110. Contact elements 110 may be of either single-sided or double-sided type. The interior construction of slots 112 is similar to that of housing 104 shown in FIGS. 7A, 7B, and 8.

Figure 13A:
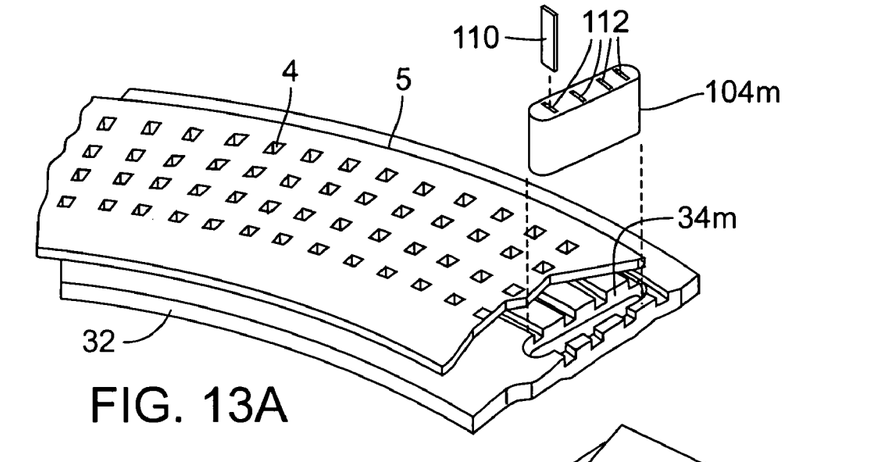

FIG. 13A shows a vacuum plate 32m, which is vacuum plate 32 modified to accommodate common housing 104m. Vacuum plate 32m is formed by removing the material separating holes 30 to form an elongated slot 30m sized to receive housing 104m. FIG. 13B shows a base member 36m, which is base member 36 modified to clamp common housing 104m between upwardly projecting wall 38 and releasable clamping mechanism 42. Base member 36m is formed by removing the scallop segments 40 of base member 36 to form a smooth surface recess 40m into which common housing 104m can fit securely when clamped.

Figures 14A, 14B:
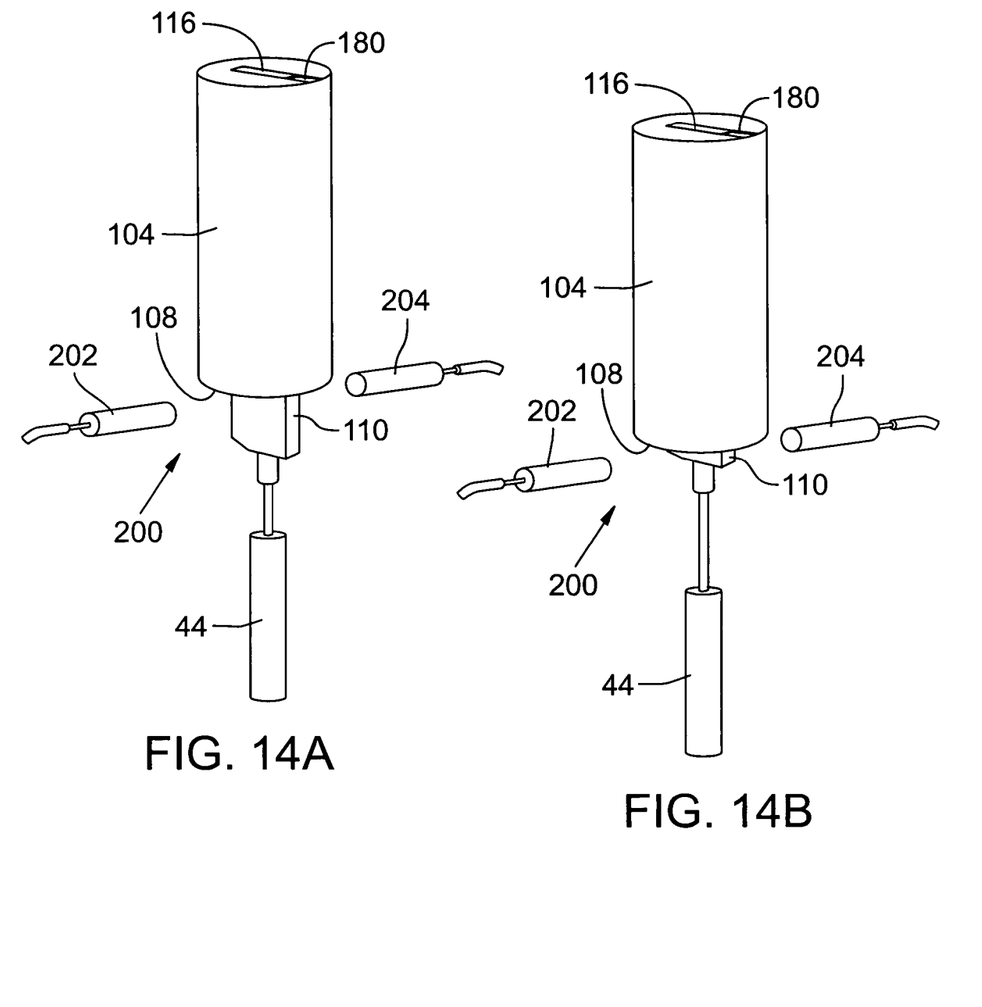
FIGS. 14A and 14B are fragmentary isometric views of a lower contact similar to that of FIG. 8 positioned between components of an optical contact wear sensor with a contact element of, respectively, nominal operational length and shortened length resulting from excessive wear.

FIGS. 14A and 14B show an optical contact wear sensor 200 that detects when contact tip 116 is worn down and therefore contact element 110 needs either replacement or, if double-sided with an unused side available, reversed in direction of movement of housing 104. Contact wear sensor 200 includes a light emitter 202 and a light detector 204 positioned on either side of contact element 110 protruding from lower surface 108 of housing 104 and arranged to provide a direct line of sight light propagation path. As shown in FIG. 14A, whenever contact tip 116 has sufficient electrode material remaining, contact element 110 interrupts the light propagation path between light emitter 202 and light detector 204. As shown in FIG. 14B, whenever contact tip 116 has undergone an amount of electrode material removal that shortens the length of contact element 110 by a predetermined amount, light propagating from light emitter 202 reaches light detector 204 to produce a signal indicating excessive wear of contact tip 116.

A contact head designed in accordance with the present invention was tested in a Model 3300B Multi-Function tester. The test conditions were as follows: the DUT was a 100 pF capacitor, the test frequency was set to 1 MHz, the upper limit for the decontamination factor (DF) was set at 0.0007, and the DUT actual DF was set to between about 0.0002 and about 0.0003. The results of the test were as follows: of the 113,257 DUTs that were tested, only 0.51% of them were falsely rejected. In comparison to the about 5.89% false rejection rate of prior art contact heads, this is a significant decrease in false rejections. This decrease in false rejection results in a consequent increase in productivity and machine throughput.

It will be obvious to those having skill in the art that many changes may be made to the details of the above-described embodiments without departing from the underlying principles of the invention. For example, preferred embodiments of the contact head of the present invention include a plurality of lower contacts for simultaneously testing more than one DUT, but can also include a single lower contact. The scope of the present invention should, therefore, be determined only by the following claims.

The invention claimed is:

1. A contact assembly configured for use in an electrical component handler and performance of electrical measurement of electrical components, the electrical components seated in a component holder that has a surface and advances relative to a contact tip of a contact element to successively place the electrical components in contact with the contact tip to perform the electrical measurement and to impart sliding contact of the surface of the component holder against the contact tip when none of the electrical components is in contact with the contact tip, comprising:

a housing having a length and an interior slot formed along the length of the housing, the interior slot defined by interior walls that form bearing surfaces;

a contact element sized to fit in the interior slot and slide lengthwise in the housing along the bearing surfaces, the contact element including opposite ends, one of which terminating in a contact tip formed of electrically conductive contact tip material; and     the electrically conductive contact tip material exhibiting wear characteristics such that, in response to the sliding contact of the contact tip against the surface of the component holder as the component holder advances to successively place the electrical components to perform the electrical measurement, the electrically conductive contact tip material undergoes removal and thereby results in purposeful progressive shortening of the contact element to present a refreshed electrically conductive contact tip to the electrical components during the performance of electrical measurement.

2. The contact assembly of claim 1, in which the contact tip has a sloped edge that provides a slide ramp for the electrical component.

3. The contact assembly of claim 1, in which the other one of the ends of the contact element terminates in a contact tip formed of electrically conductive contact tip material exhibiting wear characteristics such that, in response to the sliding contact of the contact tip against the surface of the component holder as the component holder advances to successively place the electrical components to perform the electrical measurement, the electrically conductive contact tip material undergoes removal and thereby results in purposeful progressive shortening of the contact element to present a refreshed electrically conductive contact tip to the electrical components during the performance of electrical measurement.

4. The contact assembly of claim 1, in which the contact element has a length and includes a slot having a slot length that extends along the length of the contact element, the slot length defining a travel limit for the contact element when it is placed in the housing.

5. The contact assembly of claim 1, in which the housing has an end surface into which a chamfer is formed adjacent an edge of the interior slot, the chamfer providing a ramp along which an electrical component can slide away from and not catch on the edge of the interior slot.

6. The contact assembly of claim 1, in which the housing is formed as a one-piece unitary article.

7. The contact assembly of claim 1, in which the housing includes first and second component parts of complementary shape that, when assembled as a unitary article, form the interior slot.

8. The contact assembly of claim 7, in which the first and second component pans are in the shapes of generally cylindrical segments.

9. The contact assembly of claim 1, in which the contact element constitutes a member of a set of multiple contact elements, the housing includes a set of multiple interior slots formed along the length of the housing and defined by interior walls that form bearing surfaces, and the interior slot constitutes a member of the set of multiple interior slots, the multiple interior slots sized to receive different ones of the contact elements.

10. A double-sided contact element configured for placement in a contact assembly of an electrical component handler and performance of electrical measurement of electrical components, the electrical components seated in a component holder that has a surface and advances relative to a contact tip of a contact element to successively place the electrical components in contact with the contact tip to perform the electrical measurement and to impart sliding contact of the surface of the component holder against the contact tip when none of the electrical components is in contact with the contact tip, comprising:

a body including first and second opposite end portions terminating in respective first and second contact tips, the first and second end portions being of generally rectangular cross-section, and each of the first and second contact tips formed of electrically conductive contact tip material exhibiting wear characteristics such that, in response to the sliding contact of the contact tip against the surface of the component holder as the component holder advances to successively place the electrical components to perform the electrical measurement, the electrically conductive contact tip material undergoes removal and thereby results in purposeful progressive shortening of the contact element to present a refreshed electrically conductive contact tip to the electrical components during the performance of electrical measurement.

11. The contact element of claim 10, in which each of the first and second contact tips has a sloped edge that provides an electrical component slide ramp.

12. The contact element of claim 10, in which the body has a length and includes a slot having a slot length that extends along the length of the body, the slot length defining a travel limit for the contact element when it is placed in a housing.

13. The contact element of claim 10, in which the body includes a resilient body portion positioned between the first and second end portions.

14. The contact element of claim 10, in which the first and second end portions constitute opposite distal ends of a unitary body portion of generally rectangular cross-section.

\* \* \* \* \*